United States Patent [19]

Holmes et al.

[11] Patent Number: 4,725,330
[45] Date of Patent: Feb. 16, 1988

[54] EQUILIBRATION OF LITHIUM NIOBATE CRYSTALS

[75] Inventors: Ronald J. A. Holmes, North Hampton; You S. Kim, Emmaus, both of Pa.; Henry M. O'Bryan, Jr., Plainfield, N.J.

[73] Assignee: American Telephone and Telegraph Company, AT&T Bell Laboratories, Murray Hill, N.J.

[21] Appl. No.: 731,099

[22] Filed: May 6, 1985

[51] Int. Cl.$^4$ .................... C30B 31/08; C30B 33/00; C30B 29/30

[52] U.S. Cl. .................... 156/610; 156/612; 156/DIG. 71; 156/DIG. 87; 156/DIG. 83; 350/96.12

[58] Field of Search ............... 156/612, 610, DIG. 89, 156/DIG. 83, DIG. 71; 423/593; 350/96.12

[56] References Cited

U.S. PATENT DOCUMENTS

| | | | |
|---|---|---|---|
| 3,998,687 | 12/1976 | Ballman et al. | 423/593 |
| 4,071,323 | 1/1978 | Holman | 156/612 |
| 4,071,396 | 1/1978 | Holman | 156/DIG. 83 |
| 4,439,265 | 3/1984 | Alferness et al. | 156/DIG. 89 |

OTHER PUBLICATIONS

Esdaile, Appl Phys Lett 33(8) 10/78, pp. 733-734, Closed-Tube Control of Out-Diffusion During Fabrication of Optical Waveguides in LiNbO$_3$.
Chen et al., Appl Phys Lett v30, No. 11, 6/77, pp. 570-571, Elimination of Li$_2$O Out-Diffusion Waveguide in LiNbO$_3$ and Li Ta O$_3$.
Reviews of Modern Physics, vol. 49, No. 2, pp. 361-420, Apr. 1977, "Integrated Optics and New Wave Phenomena in Optical Waveguides", by P. K. Tien.
Proceedings of the IEEE, vol. 62, No. 8, pp. 1044-1060, Aug. 1974, "Guided Wave Optics", by H. F. Taylor and A. Yariv.
IEEE Journal of Quantum Electronics, vol. QE-17, No. 6, Jun. 1981, "Guided-Wave Devices for Optical Communication", by R. C. Alferness, pp. 946-959.

Primary Examiner—Gary P. Straub
Attorney, Agent, or Firm—Walter G. Nilsen

[57] ABSTRACT

A process is described for producing optical integrated circuits on lithium niobate substrates in which the composition of the lithium niobate substrates is adjusted by a powder bed equilibration procedure. This procedure involved exposure of the lithium niobate crystals to a powder bed in a crucible during a heat treatment. A similar procedure is used during production of optical integrated circuits to maintain the desired Li/Nb composition in the substrate.

6 Claims, 7 Drawing Figures

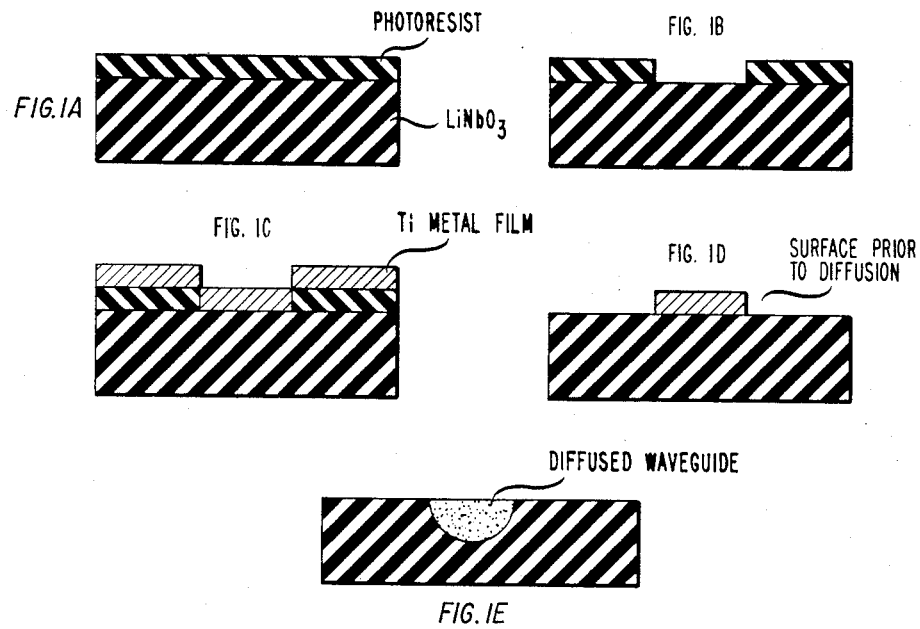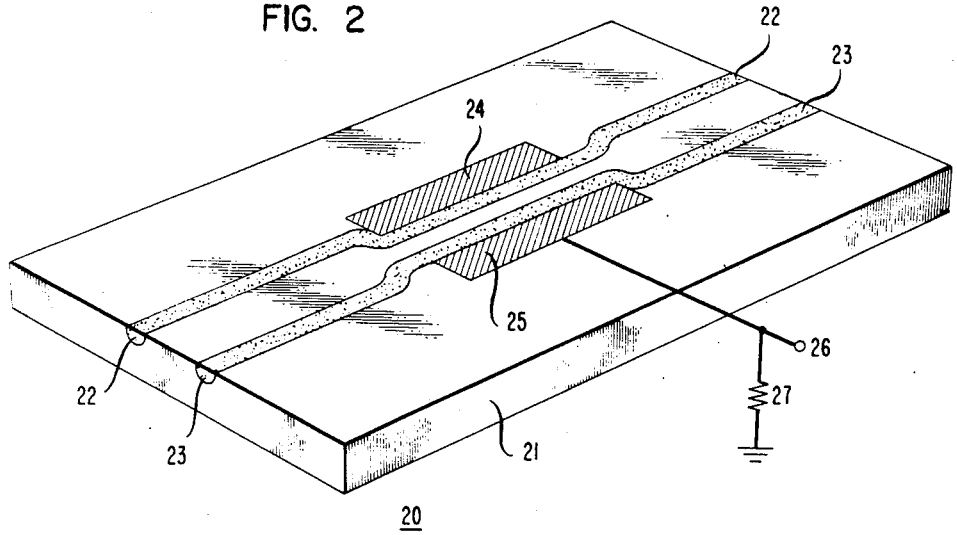

EQUILIBRATION OF LITHIUM NIOBATE CRYSTALS

TECHNICAL FIELD

The invention involves fabrication of integrated optical devices.

BACKGROUND OF THE INVENTION

The development of the optical laser and other unique light sources has opened up a whole new area of commercial endeavor involving optical communications, optical memories, optical logic circuits, optical processing of information, etc. A particularly important class of devices associated with optical processing of information is the optical integrated circuit. Such optical integrated circuits have been described in detail in a number of references including "Integrated Optics and New Wave Phenomena in Optical Waveguides," by P. K. Tien, in *Reviews of Modern Physics*, Volume 49, No. 2, pp. 361-381, April 1977, and "Guided Wave Optics," by H. F. Taylor and A. Yariv, *Proceedings of the IEEE*, Volume 62, No. 8, pp. 1044-1060, August 1974. A recent review of this subject matter is given by R. C. Alferness in a paper entitled, "Guided-Wave Devices for Optical Communication," *IEEE Journal of Quantum Electronics*, Volume QE-17, No. 6, June 1981.

A particular procedure for fabricating guided-wave devices involves use of a lithium niobate substrate. Adjustment of the composition of the lithium niobate is particularly important so as to form a low-loss homogeneous medium for the optical device. Indeed, a homogeneous substrate material is required to provide the uniform index of refraction needed for good integrated device performance. A rapid, inexpensive, reliable procedure is needed for the commercial manufacture of lithium niobate substrates with a specific homogeneous composition and uniform optical properties. A particular procedure for adjusting the composition of lithium niobate is described in U.S. Pat. No. 4,071,323 issued to R. L. Holman on Jan. 31, 1978.

In addition to adjusting the composition of the lithium niobate and homogenizing the composition and optical properties of the lithium niobate substrates, it is highly desirable to have a simple, convenient procedure for maintaining composition and homogeneity during fabrication procedures involving heating. For example, diffusion of various elements into lithium niobate substrates to form waveguide sections often is accompanied by loss of homogeneity or composition change in the lithium niobate substrate.

SUMMARY OF THE INVENTION

The invention is a process for making integrated optical circuits on lithium niobate substrates in which the substrate is exposed to a powdered source of lithium to adjust the ratio of lithium to niobium. Generally, the powder bed equilibration process is carried out in a closed container, typically a closed $Al_2O_3$ container, with the lithium niobate crystals in close proximity to the powder bed. Generally, the mass of material in the powder bed is large (at least four times as large but preferably at least ten times larger) compared to the mass of the lithium niobate crystals. The powder bed equilibration process is carried out at elevated temperatures, generally at close to the Curie temperature without exceeding the Curie temperature (typically about 1130 degrees C.). The equilibration process preferably takes place within about 100 degrees of the Curie temperature with a typical treatment time of 30 to 800 hours. The shorter time applies to the higher treatment temperature. Higher temperatures (up to the melting point of about 1180 degrees C.) may be used with corresponding reduction in treatment time (down perhaps to three hours) but usually poling prior to equilibration yields a more controlled (but more time-consuming) device.

BRIEF DESCRIPTION OF THE DRAWING

FIG. 1 shows several side-view diagrams of a lithium niobate substrate undergoing a process for fabricating an integrated optical circuit;

FIG. 2 shows a typical integrated optical circuit; and

DETAILED DESCRIPTION

Figure 3:
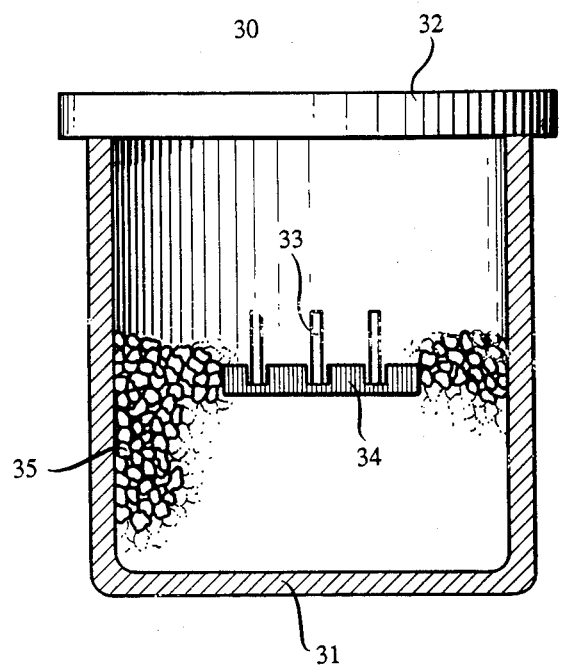
FIG. 3 shows a side view of a powder bed equilibrium crucible showing $LiNbO_3$ crystals being equilibrated.

The invention is based on the observation that lithium niobate substrate crystals can be made highly homogeneous and their composition changed in relatively short times by heat treating them in close proximity to a powder bed containing a source of lithium in a closed container.

The powder bed equilibration procedure is used in three ways: first, to homogenize the composition and optical properties of the lithium niobate substrates (with or without significant composition charge); second, during processing at high temperatures to maintain a homogeneous composition; and third, to change the lithium composition. Typical processing often involves heat treatment to diffuse elements into the lithium niobate as, for example, in the formation of optical waveguides.

The powder bed composition often depends on the particular equilibration procedure being carried out and the composition desired for the lithium niobate single crystals. Generally, the powder bed is made the desired composition of the lithium niobate crystals being equilibrated. Often, the powder bed is made by reacting together at high temperatures lithium carbonate and niobium carbonate in proper proportions to form polycrystalline lithium niobate of the desired composition of the lithium niobate crystals. For example, the procedure might be carried out on congruent melting lithium niobate (composition 48.5 mole percent lithium, 51.5 mole percent niobium) so as to obtain a homogeneous composition of 49.5 mole percent lithium and 50.5 mole percent niobium. A powder bed is made of polycrystalline lithium niobate made, for example, by reacting in the proper temperature range lithium carbonate and niobium carbonate with composition in the molar ratio of 49.5 to 50.5. This yields a powder bed (after pulverizing the reaction product) with the proper lithium activity to equilibrate the single crystal lithium niobate substrates at the desired composition.

Where equilibration at the stoichiometric composition (50 mole percent lithium) is desired, a simplified approach to the powder bed composition may be used. Here, a mixture of $LiNbO_3$ and $Li_3NbO_4$ may be used since this mixture, from phase diagram considerations, yields a lithium activity equal to that for stoichiometric lithium niobate. Mole compositions of 1-99 mole percent $Li_3NbO_4$, remainder $LiNbO_3$ yield satisfactory results but usually 20-40 mole percent $Li_3NbO_4$ is preferred for convenience. The stoichiometric composition is often preferred because the higher Curie temperature allows equilibration to be carried out at a higher temperature without depoling, and the waveguide fabrication procedure (e.g., titanium diffusion) can be carried out at a higher temperature where fewer planar defects are obtained. Also, pinning the composition to the phase boundary composition yields better composition control and homogeneity.

A typical equilibration procedure will serve to illustrate the invention. The procedure may be carried out on lithium niobate crystals to change the composition or homogenize the composition and/or the optical properties. The procedure may also be carried out as part of the diffusion procedure for making the optical waveguides.

First, the equilibration process is described for lithium niobate substrates without simultaneous diffusion of elements into the substrate. Generally, the lithium niobate boules previous to the equilibration treatment are annealed at about 1180 degrees C. (±40 degrees C.) for about two hours and then poled at about 1180 degrees C. (±40 degrees C.) for two hours. Plates are cut from the boule so that their plane is perpendicular to the growth direction. With some crystals, the plates are cut prior to annealing and poling and the anneal and poling steps carried out on the already cut plates. Often, it is preferred to anneal the cut and poled plates at 1050 to 1080 degrees C. for 40–800 hours prior to the equilibration procedure. The equilibration procedure takes place in a closed container, typically is made of $Al_2O_3$ with a platinum foil and $Al_2O_3$ cover to close the container.

The lithium niobate crystal is placed in the container in close proximity to the powder bed. Generally, the powder bed is placed at the bottom of the container with the lithium niobate crystals just above the powder bed. As described above, the composition of the powder bed depends on the desired composition of the lithium niobate substrates.

The containers are heated to effect equilibration of the lithium niobate crystals. Where the crystals are already poled and depoling is to be avoided, the temperature used is about 30 degrees below the Curie temperature (e.g., 1130 degrees C. for a congruent composition), typically 1090 to 1110 degrees C., preferred 1100 degrees C.±5 degrees C. Progress can often be monitored by weighing the crystals. Close proximity to the powder bed (preferably within 2 cm), including burying the lithium niobate crystals in the powder bed insures rapid equilibrations. Typical equilibration times are about 500 hours at 1100 degrees C. After the equilibration time, the crystals are cooled to room temperature.

A typical procedure for making the optical waveguide circuit is as follows. The optical waveguide is made by diffusing titanium into the lithium niobate substrate. The titanium pattern is made by a typical photoresist procedure. A photoresist layer is put down on a lithium niobate as shown in FIG. 1a. Photographic techniques are used to pattern the photoresist by opening holes where waveguide is to be fabricated (see FIG. 1b). Deposition of titanium is then carried out to cover the entire surface of the substrate (FIG. 1c). On removal of the photoresist material, a pattern of titanium metal is left on the surface. In order to form the integrated optical circuit, a diffusion process is carried out to diffuse the titanium metal into the lithium niobate substrate. To insure that the composition and homogeneity of the lithium niobate substrate remains unchanged during the titanium diffusion, the diffusion process is carried out in a closed container with the lithium niobate in close proximity to a powder bed with lithium activity the same as the lithium niobate substrate. Generally, this is done as indicated above with the equilibration process. Generally, the temperature in the titanium diffusion process is governed by the requirements of the titanium diffusion process since the powder bed is present to maintain composition and homogeneity and not to change composition or achieve homogeneity. This is the principal reason that equilibration and homogenation is carried out prior to the diffusion step. The diffusion is typically carried out in the temperature range from 1050 to 1100 degrees C. for one to 10 hours.

A typical optical integrated circuit 20 is shown in FIG. 2. Here, the particular optical integrated circuit 20 is a directional coupler. This device is made up of a substrate 21 of lithium niobate equilibrated in accordance with the invention. Optical waveguide sections 22 and 23 are also evident and made in accordance with the invention. These waveguide sections extend along the substrate and out the other end. Electrical electrodes 24 and 25 are also present to affect coupling between the optical waveguides. In one mode of operation, light is introduced into waveguide 23 and in the absence of applied voltage of the electrodes exits waveguide 22. On applying a proper potential to electrode 25, through terminal 26 and resistor 27, the light remains in and exits waveguide 23. Various other integrated optical circuits can be made in accordance with the invention. The advantage of composition adjustment and homogenation of the lithium niobate substrate is in the performance of the optical integrated circuit. Losses are less, coupling parameters greatly improved, scattering and reflections less and mode characteristics much improved.

FIG. 3 shows a typical apparatus 30 used to equilibrate $LiNbO_3$ crystals in accordance with the invention. The apparatus 30 is made up of a container or crucible 31 made of alumina and crucible cover 32 also made of alumina. The lithium niobate crystals 33 are held in place by means of an alumina support 34. Also present in the crucible is the source of lithium in the equilibration process 35 often in the form of pre-reacted lithium niobate of the desired Li/Nb ratio or a powder mixture of $LiNbO_3$ and $Li_3NbO_4$.

What is claimed is:

1. A process for treating lithium niobate substrates used in the fabrication of integrated optical circuits, which comprise said substrate and optical waveguides, the process comprising equilibrating the lithium niobate substrate prior to formation of the optical waveguide by heating the substrate in the presence of a powder bed comprising lithium niobate in a container to a temperature range from 1050 to 1180 degrees C. for a time between 30 and 800 hours, said lithium niobate substrate being placed in the powder bed and in contact with the powder of the powder bed.

2. The process of claim 1 in which the powder base comprises lithium niobate with composition approximately the same as that desired for the lithium niobate substrate.

3. The process of claim 2 in which the desired composition for the lithium niobate substrate is the stoichiometric composition and the powder bed further comprises $Li_3NbO_4$.

4. The process of claim 1 in which the mass of the powder bed is at least 4 times the mass of the lithium niobate crystal being equilibrated.

5. The process of claim 1 in which the lithium niobate is first annealed, then poled and then equilibrated in the temperature range from 1050 to 1130 degrees C. for 30 to 800 hours.

6. The process of claim 1 in which the container comprises $Al_2O_3$ and is substantially closed.

* * * * *